(12) United States Patent  
Towns et al.

(10) Patent No.: US 8,361,636 B2
(45) Date of Patent: Jan. 29, 2013

(54) LUMINESCENT POLYMER

(75) Inventors: Carl Towns, Essex (GB); Richard O'Dell, Taufkirchen (DE)

(73) Assignee: Cambridge Display Technology Limited, Cambridge (GB)

( * ) Notice: Subject to any disclaimer, the term of this patent is extended or adjusted under 35 U.S.C. 154(b) by 485 days.

(21) Appl. No.: 11/872,216

(22) Filed: Oct. 15, 2007

(65) Prior Publication Data

US 2008/0053520 A1   Mar. 6, 2008

Related U.S. Application Data

(63) Continuation of application No. 10/169,692, filed as application No. PCT/GB01/00019 on Jan. 4, 2001, now abandoned.

(60) Provisional application No. 60/185,895, filed on Feb. 29, 2000.

(30) Foreign Application Priority Data

Feb. 25, 2000  (GB) .................................. 0004542.7
Mar. 13, 2000  (WO) ...................... PCT/GB00/00911
May 1, 2000  (GB) .................................. 0000091.9

(51) Int. Cl.
*H01J 1/62*  (2006.01)
*C09K 11/06*  (2006.01)
*C09K 11/02*  (2006.01)
*H01L 29/08*  (2006.01)
*H01L 33/00*  (2010.01)
*C08F 28/06*  (2006.01)
*C08G 79/08*  (2006.01)

(52) U.S. Cl. ........ 428/690; 428/917; 313/504; 313/506; 252/301.16; 252/301.35; 257/40; 257/103; 526/256; 526/257; 526/258; 526/266; 526/279; 528/10; 528/377; 528/394; 528/423; 528/425

(58) Field of Classification Search ................... None
See application file for complete search history.

(56) References Cited

U.S. PATENT DOCUMENTS 6,599,444 B2 * 7/2003 Burnell-Jones ........... 252/301.36
6,861,502 B1 * 3/2005 Towns et al. .................... 528/422

* cited by examiner

*Primary Examiner* — Camie Thompson
(74) *Attorney, Agent, or Firm* — DLA Piper LLP (US)

(57) ABSTRACT

A luminescent polymer comprising a triarylene repeat unit which comprises a triarylene of general formula (I) which is substituted or unsubstituted and an arylene repeat unit -[-Ar-]- that is different from the triarylene repeat unit wherein X, Y, and Z are each independently O, S, $CR_2$, $SiR_2$ or NR and each R is independently alkyl, aryl or H.

32 Claims, 1 Drawing Sheet

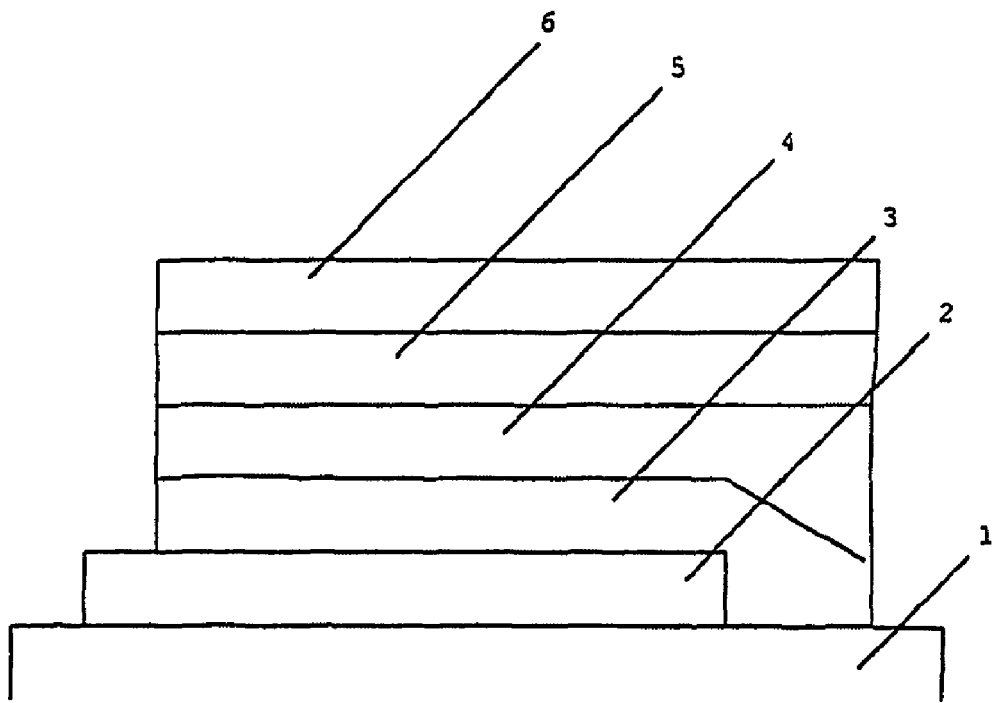

LUMINESCENT POLYMER

CROSS-REFERENCE TO RELATED APPLICATIONS

This application is a continuation of U.S. patent application Ser. No. 10/169,692 filed on Nov. 7, 2002 now abandoned which is a National Stage of International Application No. PCT/GB01/00019, filed Jan. 4, 2001, which claims the benefit of U.S. Provisional Application No. 60/185,895, filed on Feb. 29, 2000; as well as Great Britain Application No. 0000091.0, filed on Jan. 5, 2000; and Great Britain Application No. 0004542.7, filed on Feb. 25, 2000. The disclosures of the above applications are incorporated herein by reference.

FIELD

The present invention relates to a novel luminescent polymer, especially for use in an optical device such as an optical device comprising an electroluminescent device.

BACKGROUND

Electroluminescent devices are structures which emit light when subject to an applied electric field. In its simplest forms an electroluminescent device comprises a light-emissive layer between two electrodes. The cathode electrode injects negative charge carriers electrons) and the anode electrode injects positive charge carriers (holes) into the light-emissive layer. Light emission occurs when the electrons and holes combine in the light-emissive layer to generate photons. As a practical aspect, one of the electrodes is typically transparent, to allow the photons to escape the device. The light-emissive layer should be made from a light-emissive material which may be laid down as a film without substantially affecting the luminescent characteristics of the material and which is stable at the operational temperature of the device.

Organic electroluminescent devices which use an organic material as the light-emissive material are known in this art. Among organic materials, simple aromatic molecules such as anthracene, perylene and coronene are known to show electroluminescence. U.S. Pat. No. 4,539,507 discloses the use of small molecule organic materials as the light-emissive material, such as 8-hydroxy quinoline (aluminium) "Alq". PCT/WO90/13148 discloses an electroluminescent device comprising a semiconducting layer comprising a polymer film as the light-emissive layer which comprises at least one conjugated polymer. In this case, the polymer film comprises a poly(para-phenylenevinylene) (PPV) film.

The color of the light generated by the light-emissive material is determined by the optical gap or bandgap of the organic light-emissive materials, that is to say the difference in energy levels between the "highest occupied molecular orbital" ("HOMO") and the "lowest unoccupied molecular orbital" ("LUMO") levels. Effectively, the bandgap is the energy difference between the valence and conduction bands. These levels can be estimated by photoemission measurements and measurements of the electrochemical potentials for oxidation and reduction. The level of these energies is affected by numerous factors. Accordingly, the use of such values is indicative rather than quantitative.

It is known to use a semiconductive conjugated copolymer as the light-emissive layer in an electroluminescent device. The semiconductive conjugated copolymer comprises at least two chemically different monomer units which, when existing in their individual homopolymer forms, typically have different semiconductor bandgaps. The proportion of the chemically different monomer units in the copolymer can be selected to control the semiconductor bandgap of the copolymer so as to control the optical properties of the copolymer. To some degree, the extent of conjugation of the copolymer can be said to affect the Π-Π* bandgap of the copolymer. Increasing the extent of conjugation has the effect of decreasing the bandgap up to the point of bandgap convergence. Therefore, selection of appropriate reaction components may be used to modulate the bandgap. This property may be exploited so that the semiconductor bandgap is modulated to control the wavelength (i.e. color) of radiation emitted during luminescence. This gives the very desirable feature of controlling the color of light output from the polymer. This property is useful particularly in the construction of electroluminescent devices.

EP 0686662 discloses a device for emitting green light. The anode is a layer of transparent indium-tin oxide. The cathode is a LiAl layer. Between the electrodes is a light-emissive layer of PPV. The device comprises also a hole transport layer of polyethylene dioxythiophene which provides an intermediate energy level which aids the holes injected from the anode to reach the HOMO level in the PPV.

"Efficient Blue-light Emitting Devices From Conjugated Polymer Blends", Burgeson et al., Adv. Mater. 1996, 8, No. 12, pages 982-985 describes a blue-light emitting device which employs conjugated polymer blends. The emissive layer of the dev ice consists of a blend of PDHPT with PDPP. Light emission is from the PDHPT alone.

Organic materials having smaller optical gaps, towards the red end of the visible spectrum, are of particular interest at present. It has been suggested that conjugated polymers that possess narrow bandgaps are a current topic of interest because such polymers will be useful not only in optical devices but are expected to be promising candidates for intrinsic organic conductors, non linear optical devices, solar cells and IR emitters and detectors.

However, few low bandgap polymer materials are known which show good optical device characteristics when used in an optical device. These characteristics include the quantum efficiency of the copolymer when excited to luminesce, the solubility and processability of the polymer and the lifetime of the polymer when used in a device. For electroluminescence, the quantum efficiency is defined as photons out per electron injected into the structure. Other relevant characteristics for consideration are stability of the polymer during use and storage of the device.

Low bandgap materials are not well known partly because they are difficult to make.

It may be noted that polymers made by electrochemical oxidative coupling usually are not suitable for use as emitters in an electroluminescent device. This is because they have poor device characteristics such as having a large number of defects and being substantially insoluble and not processable.

In Windle et al. J. Org. Chem., 1984, 49, 3382 and Kobayshi et al., J. Chem. Phys., 1985, 82, 5717 the reported discovery of polybenzo [c] thiophene whose bandgap is about 1 eV lower than that of polythiophene showed a possibility of tuning the bandgap by structural modification. Recently, efforts have been devoted theoretically and experimentally in order to explore the correlation between the structures and bandgaps of polymers and to further reduce bandgaps.

Several approaches to achieving a narrow bandgap have been suggested. One is the copolymerisation of aromatic and o-quinoid units, indicating that the combination of monomer segments with different electronic structures can lower the bandgap through the relaxation of bond-length alternation. This is discussed in Kurti et al, J. Am. Chem. Soc. 1991, 113, 9865.

Another approach is the alternation of strong electron-donating and electron-accepting moieties as disclosed in Havinger et al, Polym. Bull., 1992. 29, 119. This suggests that the mixing of monomer segments with higher HOMO and lower LUMO is effective to reduce the bandgap due to the intra chain charge transfer. The affect of steric interaction between adjacent units relating to coplanarity having regard to maximizing the effective conjugation length along the polymer backbone is addressed in Nayak et al, Macro molecules, 1990, 23, 2237.

Narrow bandgap systems symbolized as A-Q-A$_n$' where A is a kind of aromatic-donor unit and Q is a kind of o-quinoid-acceptor unit are disclosed in "Design of Narrow-bandgap polymers", Chem. Mater., 1996, 8, pages 570-578. The bandgaps determined from the polymers on ITO-coated glass electrodes vary from 0.5 to 1.4 eV. The authors conclude that these values are small compared with usual conjugated polymers, confirming that the polymers are narrow-band gap systems. Furthermore, the authors conclude that the results show that the bandgap is widely tunable by the polymer structure.

SUMMARY

Despite work in the field of narrow bandgap polymers, there is still a need for electroluminescent polymers with a chemically tunable red light emission. In particular, there is a need for such polymers which have, additionally, excellent device characteristics as discussed above. For the purposes of the present invention, the phrase red light means wavelengths in the range of 595 to 800 nm, preferably 595 to 700 nm, preferably 610 to, 650 nm, especially around 630 nm and especially wavelengths having a peak around 650 to 660 nm.

Accordingly, it is an aim of the present invention to overcome these deficiencies of the prior art and to provide such a polymer.

It is a further aim of the present invention to provide uses of the polymer.

DRAWINGS

FIG. 1 is a cut away view of an optical device in accordance with the teachings of the present invention.

DETAILED DESCRIPTION

In a first aspect, the present invention provides a luminescent polymer comprising a triarylene repeat unit which comprises a triarylene of general formula I which is substituted or unsubstituted and an arylene repeat unit -[-Ar-]- that is different from the triarylene repeat unit:

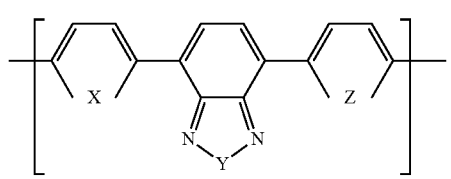

wherein X, Y and Z are each independently a group VI element or an alkyl-or aryl-substituted group V or group IV element.

The applicants have unexpectedly found that the present polymer acts as a low bandgap emitter. Furthermore, the present applicants have found that the present polymer gives good "red" emission as defined by the CIE coordinates X=0.66 and Y=0.33 or good emission in the IR range, specifically near to far IR with radiation having a wavelength of 700 nm or greater and has properties which give good device characteristics. These properties include solubility, processability, and good efficiency and lifetime in a device.

In one embodiment the polymer comprising a triarylene repeat unit which is an unsubstituted triarylene of formula:

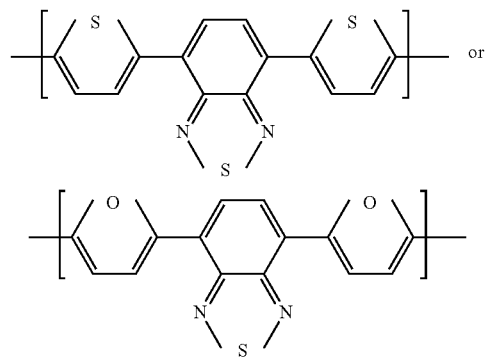

is excluded from the first aspect of the present invention.

In a further preferred embodiment, the present polymer comprises repeat units of the general formula II:

-[-triarylene repeat unit-Ar-]-

It is particularly advantageous for the molar ratio of triarylene repeat unit:Ar to be up to approximately 1:1. However, it is envisaged that the percent by weight triarylene could be in the range 0.1-50%, preferably in the range 5-10%.

More preferably, the present polymer comprises repeat units of the general formula III:

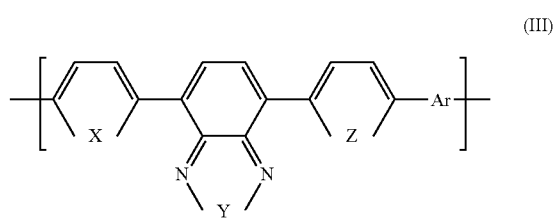

(III)

Preferably, the triarylene repeat unit comprises the general formula IV:

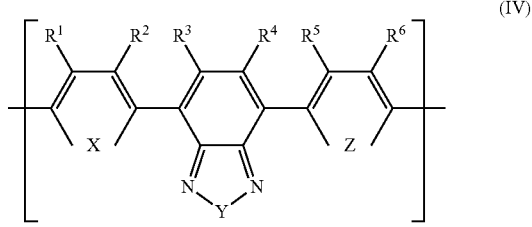

(IV)

wherein at least one of $R_1$ to $R_6$ comprises an alkyl, aryl, heteroaryl, alkylaryl, arylalkyl, CN or halide substituent.

Preferably, the aryl, heteroaryl, alkylaryl or arylalkyl is phenyl, heterophenyl, alkylphenyl or phenylalkyl.

Most preferably, all of $R_1$ to $R_6$ are H.

The position and nature of substituent R groups may be chosen so as to enhance solubility, efficiency and/or effect the color of emission by steric or electronic effects.

For the purposes of using the present polymer in an optical device, it has been found by the applicants that substitution of the color of emission and also controlling (in particular, narrowing) the width of emission.

In one preferred embodiment, $R_3$ and/or $R_4$ are methyl.

In another preferred embodiment, $R_1$, $R_2$, $R_3$, $R_4$, $R_5$ and $R_6$ are all H.

In another preferred embodiment, $R_1$ and/or $R_6$ comprise an alkyl, aryl, CN or halide while $R_2$, $R_3$, $R_4$ and $R_5$ are all H. More preferably, $R_1$ and $R_6$ each comprise hexyl and $R_2$, $R_3$, $R_4$ and $R_5$ are all H. This is because the applicants have found that substitution at positions $R_2$, $R_3$, $R_4$ or $R_5$. leads to a twisting of the triarylene unit. In turn, this reduces Π-conjugation and, therefore, increases the bandgap. This would seem to be due to steric hindrance. Electronic effects also may play a role in this effect.

Several other polymers of particular interest in accordance with the present invention are those where $R_1$ to $R_6$ are all H, or where $R_1$, $R_2$, and $R_5$. are all H while $R_3$ and $R_4$ are methyl or where $R_1$, $R_2$, $R_3$ and $R_6$ are all H and $R_4$ is methyl.

Preferably X, Y and Z are each independently O, S, C, Si or N, more preferably, O or S. Still more preferably X, Y and Z all are S. Again, it has been found that these groups result in coplanar conformations of the polymer which maximizes Π-conjugation.

A further preferred embodiment may be where X and Z are O and Y is S.

The applicants have found that arylene repeat units -[-Ar-]- which are useful in the present polymer may advantageously comprise a 2, 7-linked 9, 9 dialkyl fluorene, a 2, 7-linked 9, 9 diaryl fluorene, a p-linked dialkyl phenylene, a p-linked dialkoxy phenylene, a phenylene vinylene, a 2, 5-linked-benzothiadiazole, a 2, 5-linked alkyl benzothiadiazole, a 2, 5-linked dialkyl benzothiadiazole, a 2, 5-linked substituted or unsubstituted thiophene, a triarylamine or a bis triarylamine. -[-Ar-]- may be other substituted or unsubstituted aromatic systems such as polycyclic aromatics, fused aromatic or heterocycles.

In a further embodiment of the present invention, the polymer further comprises a further repeat unit of general formula V:

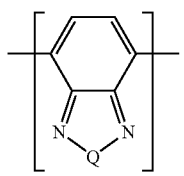

(V)

which repeat unit is substituted or unsubstituted, wherein Q is O, S, $CR_2$, $SiR_2$ or NR, more preferably O or S, still more preferably S.

The degree of polymerisation of the present polymer must be sufficient to achieve bandgap convergence. Bandgap convergence means the band gap obtained where any further increase in effective conjugation does not affect the band gap. For the present purposes, the degree of polymerisation is preferably at least 4.

The variables discussed above may be modified to tune spectral, transport and physical (for example solution) properties of the polymer.

As mentioned above, the present applicants have unexpectedly found that the variables may be selected in order to obtain a polymeric red emitter with excellent device properties. In essence, each variable in the present polymer should be chosen so that the polymer is capable of emitting light at a wavelength in the range 600 to 690 nm.

Preferably, the variables are chosen also so as to make the polymer soluble. This has the advantage of allowing the polymer to be processed in solution.

The present polymer may be prepared by a number of methods.

A preferred method of preparation is described in U.S. Pat. No. 5,777,070. The process involves contacting (i) monomers having two reactive groups selected from boronic acid, $C_1$-$C_6$ boronic acid ester, $C_1$-$C_6$ borane and combinations thereof with aromatic dihalide functional monomers or (ii) monomers having one reactive boronic acid, boronic acid ester or borane group and 1 reactive halide functional group with each other. Various aromatic monomers are proposed including those containing triarylamines. The polymerisation reaction product of this process has conjugated unsaturated internal groups.

Another preferred method of preparation is described in International patent publication No. WO 00/53656. This describes the process for preparing a conjugated polymer, which comprises polymerizing in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide functional group and one reactive boron derivative group selected from a boronic acid group, a boronic ester group and a borane group, wherein the reaction mixture comprises a catalytic amount of a catalyst suitable for catalyzing the polymerisation of the aromatic monomers, and an organic base in an amount sufficient to convert the reactive boron derivative functional groups into-$BX_3$ anionic groups, wherein X is independently selected from the group consisting of F and OH.

Polymers according to the present invention which have been produced by this method are particularly advantageous. This is because reaction times are short and residual catalyst e.g. palladium levels are low.

The present invention further provides a composition comprising a mixture comprising a luminescent polymer according to this invention.

Preferably, the composition comprises a luminescent polymer comprising a triarylene repeat unit which is an unsubstituted triarylene of formula:

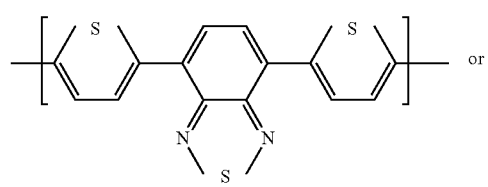 or

-continued

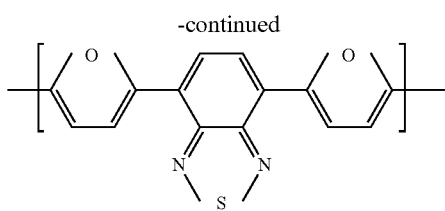

The composition may be in any suitable form, for example laid down as a sheet or layer.

The present polymer may be used in an optical device such as an optical device comprising an electroluminescent device.

Such devices may comprise a substrate and the present polymer supported on the substrate.

Usually, such electroluminescent devices would comprise a first charge carrier injecting layer for injecting positive charge carriers, a second charge carrier injecting layer for injecting negative charge carriers and a light-emissive layer located between the charge carrier injecting layers for accepting and combining positive and negative charge carriers to generate light. Optionally, the electroluminescent device may comprise a material for transporting negative charge carriers. This may either be located between the second charge carrier injecting layer and the light emissive-layer or may be located in the light-emissive layer. Where it is located in the light-emissive layer, it may be blended in a mixture with the light-emissive material. Also optionally, the electroluminescent device may comprise a material for transporting positive charge carriers. This either may be located between the first charge carrier injecting layer and the light-emissive layer or may be located in the light-emissive layer. Where it is located in the light-emissive layer, it may be blended in a mixture with the light-emissive material and optionally a material for transporting negative charge carriers.

One example of a blend or mixture which is particularly useful for use in the light-emissive layer of an electroluminescent device according to this invention consists of the three polymers shown below blended in a ratio of 99.6:0.2:0.2. The light-emissive layer may consist only of this blend or may include further polymers. This blend is capable of emitting white light when excited to luminesce.

The blend:

Polymer 1

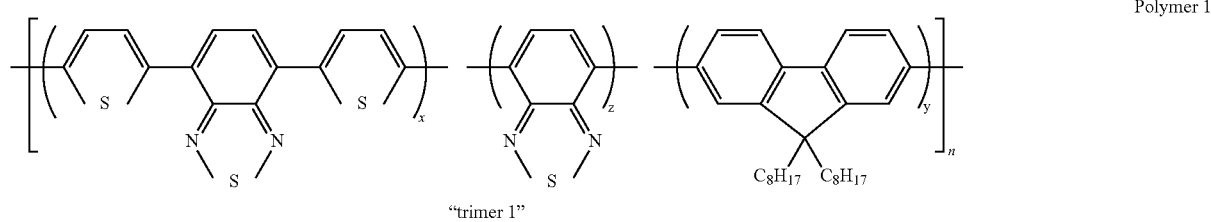

"trimer 1"

where $n \geq 4$, $0.05 \leq x + z \leq 0.5$ and $0.5 \leq y$ and $x + y + z = 1$.

Polymer 2

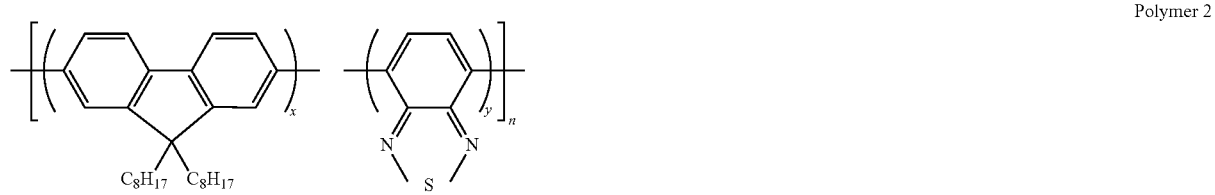

where $x + y = 1$, $0.5 \leq x$ and $y \leq 0.5$ and $n \geq 2$.

Polymer 3

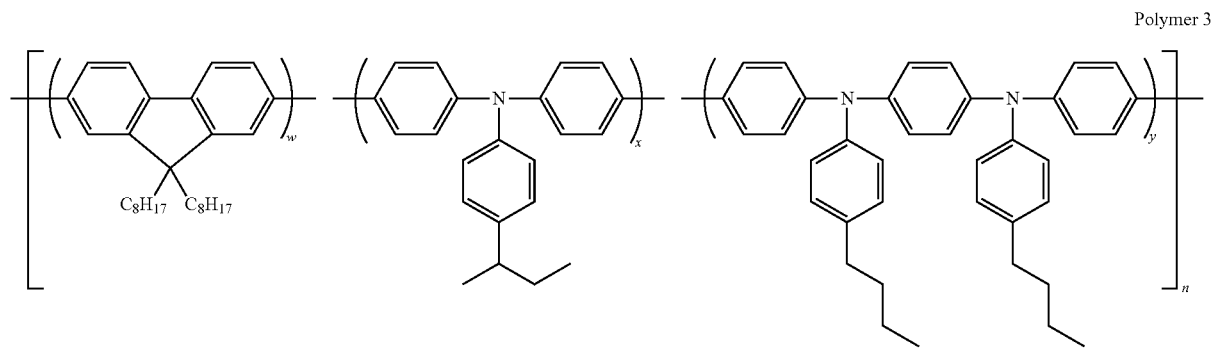

where $w + x + y = 1$, $w \geq 0.5$, $0 \leq x + y \leq 0.5$ and $n \geq 2$.

In a particularly preferred example of this blend, in polymer 1, x=0.25, y=0.5 and z=0.25. In polymer 2, x:y is 96.37:3.63 (in mole %). In polymer 3, w:x:y is 80:10:10 (in mole %) or 85:10:5 (in mole %).

Where the polymer according to the present invention is used as a light-emissive material in the light-emissive layer of an electroluminescent device, advantageously, it may be blended in a mixture with a material for transporting negative charge carriers and/or a material for transporting positive charge carriers. Where the polymer according to the present invention is capable of transporting positive and/or negative charge carriers when used in an electroluminescent device, it advantageously may be blended in a mixture with a light-emissive material in the light-emissive layer.

Where the polymer according to the present invention is blended in the light-emissive layer with one or more other materials, particularly one or more other polymers, the polymer according to the present invention preferably is present in the blend at a level of 0.2-30%, more preferably 0.5-30%.

Where the polymer according to the present invention is blended with at least two other polymers in a mixture in the light-emissive layer, the polymer according to the present invention preferably comprises a repeat unit as shown in Formula VI or VII below:

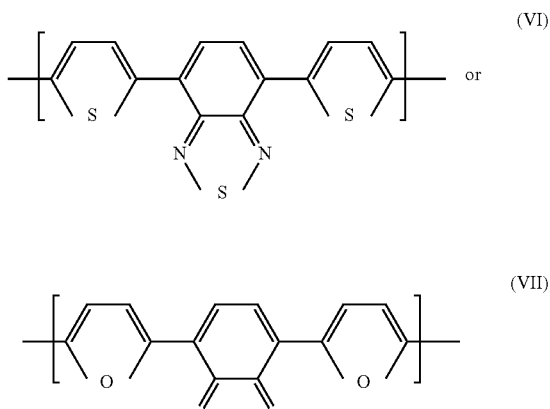

EXAMPLES

Example 1

Preparation of the Trimer

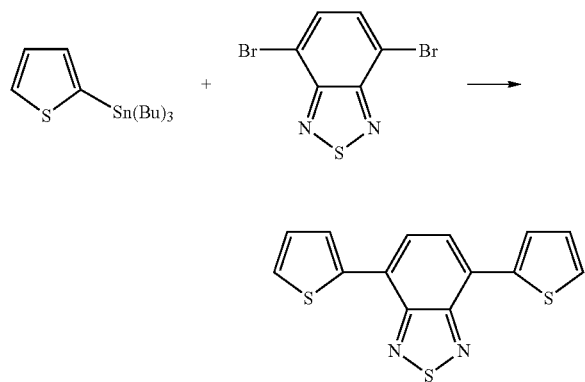

A solution of freshly distilled (0.045 mbar/89° C.) 2-(tributyl-stannyl)thiophene (78 mL, 245 mmol), dibromo benzothiadiazole (30 g, 102 mmol), and tetrakis (triphenyl-phosphine) palladium (0) (2.4 g, 2 mol %-.) in toluene (500 mL) was refluxed. After 18 h, the reaction was allowed to cool to room temp. and then reaction mixture was filtered through celite. The filtrate was evaporated to dryness and then washed with hexane to afford 26.74 g (95% yield, 100% purity HPLC).

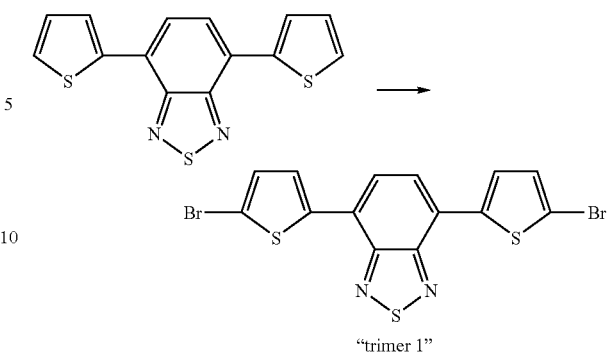

Bromination: To a solution of thiophene-dimethyl benzothiadiazole-thiophene (11.18 g, 40 mmol) in DMF (100 mL) was added dropwise N-bromosuccinimide (14.4 g) in DMF (100 mL). After 15 mins, the reaction was quenched by pouring onto a solution of ice/ethanol. The product was filtered off and washed with water. The product was recrystallized from THF to give 10.12 g (58%) of the product trimer 1 as fine dark red crystals.

Example 2

Preparation of the Trimer

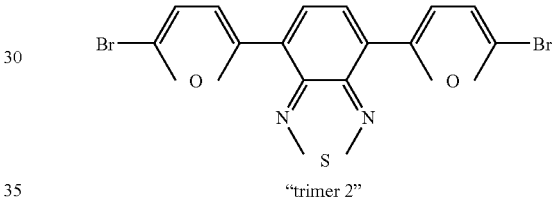

The procedure outlined for Example 1 was followed using freshly distilled (0.045 mbar/89° C.) 2-(tributyl-stannyl) furan (7.2 mL, 22.8 mmol), dibromodimethyl benzothiadiazole (3.07 g, 9.53 mmol), and tetrakis (triphenylphosphine) palladium (0) (190 mg, 2 mol). After 18 h, the reaction was allowed to cool to room temp. and then the solvent was removed under vacuum. Purification by column chromatography (5:1 Hexane:EtOAc), followed by recrystallization from EtOAc afforded 1.52 g (54% yield, 100% purity HPLC) of the desired compound as bright orange crystals; $^1$H NMR (CDCl$_3$) 7.67 (2H, dd, J 0.5, 1.8), 6.96 (2H, d, J 0.7, 3.5), 6.67 (2H, dd, J 1.8, 4.5), 2.57 (6H, s, 2×CH$_3$).

Bromination: The procedure outlined for Example 1 was followed using a solution of Furan-dimethyl benzothiadiazole-Furan (900 mg, 3.0 mmol) in DMF (10 mL), N-bromo-succinimide (1.08 g) in DMF (10 mL). After 10 mins, the reaction was quenched by pouring onto a solution of ice/ethanol. Dichloromethane was then added and the aqueous layer removed. The organic layer was evaporated to dryness and the resulting residue recrystallized from ethanol/toluene to give 1.17 g (85%) of the product "trimer 2" as fine orange/brown crystals; $^1$H NMR (CDCl$_3$) 6.99 (2H, d, J 3.3), 6.65 (2H, d, J 3.4), 2.58 (6H, s, 2×CH$_3$).

Example 3

Preparation of a Substituted Primer

Substituted versions of the trimers prepared in Examples 1 and 2 were prepared via the procedure described in Example 1 using modified starting materials. Example procedures for the preparation of modified starting materials are shown below.

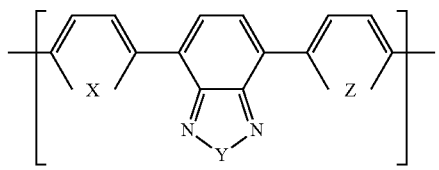

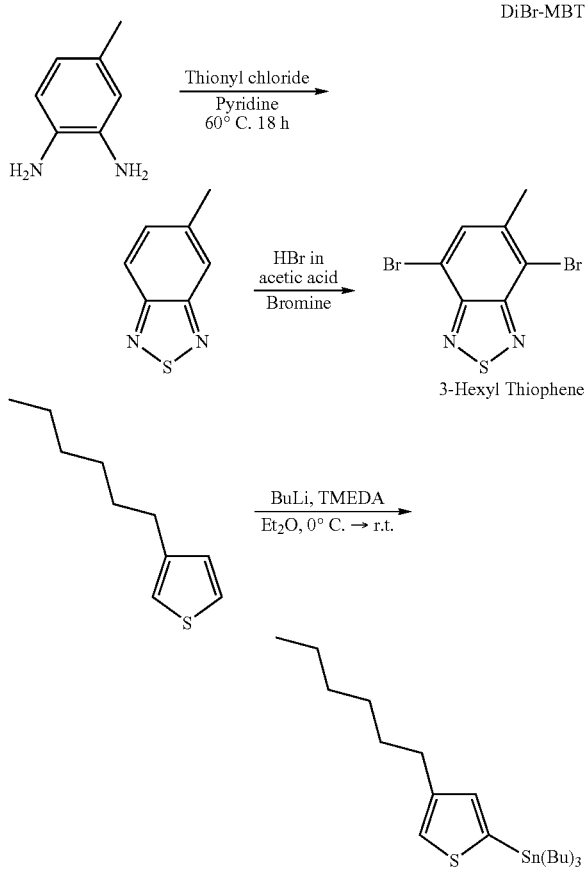

The alkyl substituents are provided for increased solubility.

Example 4

Preparation of the Polymer

A suspension of F8-diester (9.546 g, 18 mmol), dibromo-BT (2.646 g, 9 mmol), "trimer 1" (4.109 g, 9 mmol) and tetrakis (triphenyl phosphine) palladium (0) (60 mg) in toluene (180 mL) was de-gased with nitrogen. After 1 h, tetraethyl ammonium hydroxide (60 mL) was added to the reaction mixture and the suspension heated to ~115° C. (external temp.). The reaction was end-capped with bromobenzene (15 mL) after exactly 4 h 20 min. Stirring was maintained at 115° for 1 h then phenyl boronic acid (2.5 g) was added and stirring continued for a further 1.5 h. Once the reaction mixture had cooled to r. t. the polymer was precipitated into methanol (4 L). The polymer was filtered off and re-dissolved in toluene (500 mL). A solution of dithiocarbamic acid (30 g) in $H_2O$ (220 mL) was added to the toluene solution. The salt mixture was heat to 65° C. for 18 h and then the aqueous layer was removed. The organic phase was passed down an alumina/silica column, eluting the polymer with toluene. The toluene was condensed to 350 mL and then precipitated into methanol (4 L). The polymer was filtered off and dried thoroughly.

Example 5

An Optical Device

A suitable device structure is shown in FIG. 1. The anode 2 is a layer of transparent indium-tin oxide ("ITO") supported on a glass or plastic substrate 1. The anode 2 layer has a thickness between 1000-2000 Å, usually about 1500 Å. The cathode 5 is a Ca layer having an approximate thickness of 1500 Å. Between the electrodes is a light emissive layer 4 having a thickness up to about 1000 Å. The emissive layer 4 comprises between 0.5 to 30% by weight of the present polymer with the remainder of the emissive layer consisting of hole and/or electron transport material. Advantageously, the device includes a hole transport material layer 3 of PEDOT having a thickness of about 1000 Å. Layer 6 is an encapsulant layer of a suitable thickness.

What is claimed is:

1. A luminescent polymer comprising a triarylene repeat unit consisting of a triarylene of general formula IV, the luminescent polymer further comprising an arylene repeat unit [Ar] that is different from the triarylene repeat unit:

wherein at least one of $R^1$ to $R^6$ is selected from the group consisting of an alkyl, aryl, heteroaryl, alkylaryl, arylalkyl, CN, and halide substituent with the remaining $R^1$ to $R^6$ groups being hydrogen and X, Y and Z are each independently selected from the group consisting of O, S, $CR_2$, $SiR_2$ and NR, wherein each R is independently alkyl, aryl or H, wherein the luminescent polymer comprises one and only one bandgap.

2. A luminescent polymer according to claim 1, which comprises repeat units of the general formula II:

$$-[\text{triarylene repeat unit-Ar}]- \qquad (II).$$

3. A polymer according to claim 1, wherein $R^3$ and/or $R^4$ is methyl.

4. A polymer according to claim 1, wherein $R^1$ and/or $R^6$ comprise an alkyl, aryl, CN or halide, and wherein $R^2$, $R^3$, $R^4$, and $R^5$ are all hydrogen.

5. A polymer according to claim 1, wherein $R^1$ and/or $R^6$ is hexyl.

6. A polymer according to claim 1, wherein X, Y and Z are each independently O or S.

7. A polymer according to claim 6, wherein X, Y and Z are each S.

8. A polymer according to claim 1, wherein Ar comprises a 2,7-linked 9,9 dialkyl fluorene, a 2,7-linked 9,9 diaryl fluorene a p-linked dialkyl phenylene, a p-linked dialkoxy phenylene, a phenylene vinylene, a 2,5-linked benzothiadiazole, a 2,5-linked alkyl benzothiadiazole, a 2,5-linked dialkyl benzothiadiazole, a 2,5-linked substituted or unsubstituted thiophene, a triarylamine or a bis triarylamine.

9. A polymer according to claim 8, wherein Ar comprises a 2,7-linked 9,9 dioctyl fluorene.

10. A polymer according to claim 1, which further comprises a further repeat unit of general formula V:

$$(V)$$

which repeat unit is substituted or unsubstituted, wherein Q is O, S, $CR_2$ $SiR_2$ or NR and each R is independently alkyl, aryl or H.

11. A polymer according to claim 10, wherein Q is O or S.

12. A polymer according to claim 11, wherein Q is S.

13. A polymer according to claim 1, wherein the degree of polymerization is at least 4.

14. The luminescent polymer of claim 1, wherein the luminescent polymer comprises one and only one triarylene repeat unit.

15. The luminescent polymer of claim 1, where the luminescent polymer comprises less than 4 repeat units, including one and only one triarylene repeat unit.

16. An optical device or a component therefor, comprising a luminescent polymer supported on a substrate, wherein the luminescent polymer comprises a triarylene repeat unit consisting of a triarylene of general formula IV, the luminescent polymer further comprising an arylene repeat unit [Ar] that is different from the triarylene repeat unit:

(IV)

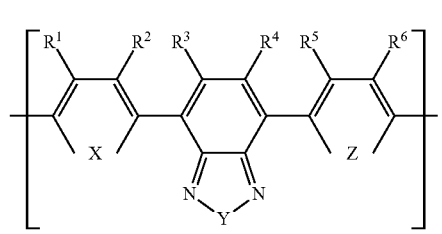

wherein at least one of $R^1$ to $R^6$ is selected from the group consisting of an alkyl, aryl, heteroaryl, alkylaryl, arylalkyl, CN, and halide substituent with the remaining $R^1$ to $R^6$ groups being hydrogen and X, Y and Z are each independently selected from the group consisting of O, S, $CR_2$ $SiR_2$ and NR, wherein each R is independently alkyl, aryl or H, wherein the optical device comprises an electroluminescent device that comprises:

a first charge carrier injecting layer for injecting positive charge carriers;

a second charge carrier injecting layer for injecting negative charge carriers;

a light-emissive layer comprising the luminescent polymer and located between the charge carrier injecting layers for accepting and combining positive and negative charge carriers to generate light, and wherein the light-emissive layer comprises a mixture of the luminescent polymer and two further polymers that are different from the luminescent polymer.

17. An optical device according to claim 16 further comprising a material for transporting positive charge carriers that is located either between the first charge carrier injecting layer and the light-emissive layer or in the light-emissive layer.

18. An optical device according to claim 16 where the two further polymers are for transporting negative charge carriers and/or transporting positive charge carriers.

19. An optical device according to claim 16, wherein the mixture comprises polymer 1, polymer 2, and polymer 3, wherein the polymers have the following structures:

Polymer 1

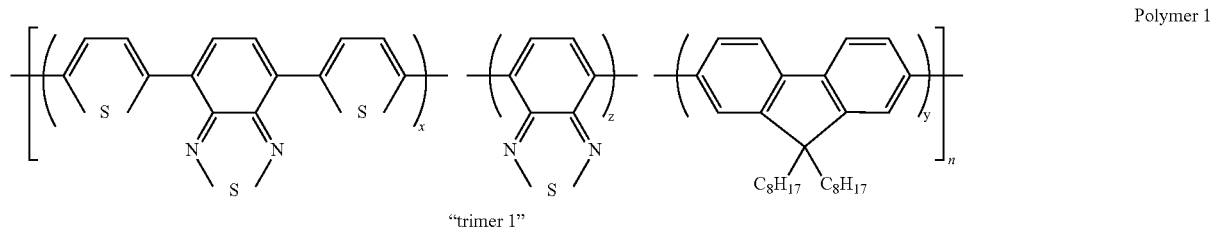

where n ≥ 4, 0.05 ≤ x + z ≤ 0.5 and 0.5 ≤ y and x + y + z = 1.

Polymer 2

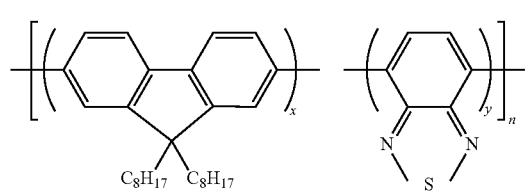

where x + y = 1, 0.5 ≤ x and y ≤ 0.5 and n ≥ 2.

Polymer 3

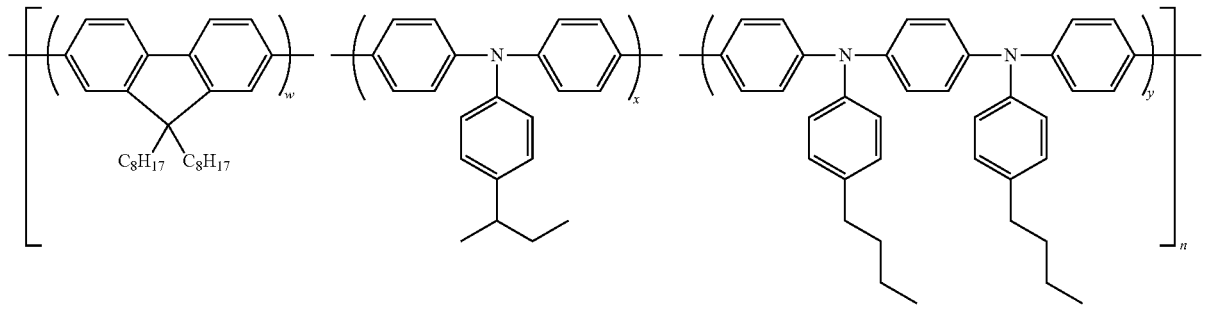

where w + x + y = 1, w ≥ 0.5, 0 ≤ x + y ≤ 0.5 and n ≥ 2.

20. An optical device according to claim 19, wherein in polymer 1, x=0.25, y=0.5, and z=0.25.

21. A solar cell comprising a luminescent polymer, wherein the luminescent polymer comprises a triarylene repeat unit which comprises a triarylene of general formula IV and an arylene repeat unit [Ar] that is different from the triarylene repeat unit:

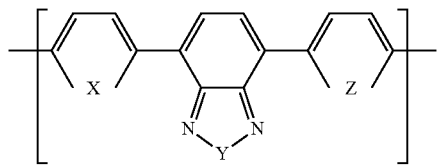

wherein at least one of $R^1$ to $R^6$ is selected from the group consisting of an alkyl, aryl, heteroaryl, alkylaryl, arylalkyl, CN, and halide substituent with the remaining $R^1$ to $R^6$ groups being hydrogen and X, Y and Z are each independently selected from the group consisting of O, S, $CR_2$, $SiR_2$ and NR, wherein each R is independently alkyl, aryl or H,
the luminescent polymer comprises one and only one bandgap.

22. A solar cell according to claim 21, wherein the luminescent polymer comprises repeat units of the general formula II:

-[triarylene repeat unit-Ar]-    (II).

23. A solar cell according to claim 21, wherein $R^3$ and/or $R^4$ is methyl.

24. A solar cell according to claim 21, wherein $R^1$ and/or $R^6$ comprise an alkyl, aryl, CN or halide, and wherein $R^2$, $R^3$, $R^4$, and $R^5$ are all hydrogen.

25. A solar cell according to claim 21, wherein $R^1$ and/or $R^6$ is hexyl.

26. A solar cell according to claim 21, wherein X, Y and Z are each independently O or S.

27. A solar cell according to claim 21, wherein X, Y and Z are each S.

28. A solar cell according to claim 21, wherein Ar comprises a 2,7-linked 9,9 dialkyl fluorene, a 2,7-linked 9,9 diaryl fluorene a p-linked dialkyl phenylene, a p-linked dialkoxy phenylene, a phenylene vinylene, a 2,5-linked benzothiadiazole, a 2,5-linked alkyl benzothiadiazole, a 2,5-linked dialkyl benzothiadiazole, a 2,5-linked substituted or unsubstituted thiophene, a triarylamine or a bis triarylamine.

29. A solar cell according to claim 21, wherein Ar comprises a 2,7-linked 9,9 dioctyl fluorene.

30. A solar cell according to claim 21, which further comprises a further repeat unit of general formula V:

which repeat unit is substituted or unsubstituted, wherein Q is O, S, $CR_2$, $SiR_2$ or NR and each R is independently alkyl, aryl or H.

31. A solar cell according to claim 30, wherein Q is O or S.

32. A solar cell according to claim 31, wherein Q is S.

* * * * *